United States Patent [19]
Ryan

[11] Patent Number: 6,004,827
[45] Date of Patent: Dec. 21, 1999

[54] INTEGRATED CIRCUIT PROCESSING

[75] Inventor: Vivian Wanda Ryan, Washington, N.J.

[73] Assignee: Lucent Technologies Inc., Murray Hill, N.J.

[21] Appl. No.: 08/922,487

[22] Filed: Sep. 3, 1997

[51] Int. Cl.⁶ ........................... H01L 21/00; H01L 21/66; G01R 31/26
[52] U.S. Cl. ................................. 438/6; 438/10; 438/17
[58] Field of Search ................................. 438/6, 10, 11, 438/14, 17, 18

[56] References Cited

U.S. PATENT DOCUMENTS 3,548,491  12/1970  Ainslie et al. ........................ 437/8

*Primary Examiner*—Brian Dutton
*Attorney, Agent, or Firm*—John T. Rehberg; Antony Grillo; William S. Francos

[57] ABSTRACT

A variety of test structures may be fabricated with aluminum runners and overlying dielectrics. The dielectrics are removed and bumps are observed upon the aluminum runners. Unevenness in the bump distribution is a predictor of long term reliability problems. A test structure may be utilized to design integrated mass production fabrication processes.

8 Claims, 1 Drawing Sheet

INTEGRATED CIRCUIT PROCESSING

TECHNICAL FIELD

This invention relates, in one embodiment, to methods for the manufacture of integrated circuits, and in another embodiment, to methods for the fabrication of metallized structures.

BACKGROUND OF THE INVENTION

Typical integrated circuits contain an array of transistors which are covered by layers of dielectric through which conductive lines run. Illustratively, these conductive lines may be made from aluminum with conductive underlayers and conductive overlayers of other materials. Typical fabrication processes involve the blanket deposition of aluminum layers, i.e. by sputtering. (As just mentioned, other conductive layers may be deposited prior to the aluminum layer and subsequent to the aluminum layer.) The aluminum layer, together with any underlayers and overlayers, is patterned by lithographic methods known to those of skill in the art to create conductive lines.

Each integrated circuit manufacturer has one or more processes or recipes for the formation of metal runners, such as aluminum, with its associated underlayers and overlayers. Each recipe may include sputtering times, metal composition, temperatures, thicknesses, etc.

Those concerned with the development of integrated circuits have, however, noticed that apparently satisfactorily manufactured integrated circuits may often fail in subsequent use. A variety of phenomena are associated with these failures. One well documented failure mechanism is termed "stress migration voiding". Stress migration voiding affects the long term reliability of the integrated circuits. Another factor affecting long term reliability is extrusion of the aluminum runner material. Since the aluminum runner undergoes more compression at the bottom of the runner then at the top, a stress gradient exists and the runner may be extruded near its bottom. Another problem which affects long term reliability is decohesion of the aluminum. Aluminum does not always adhere well to underlying dielectrics such as silicon dioxide. Sometimes underlayers such as titanium or titanium nitride do not assist in adhesion of the aluminum because the titanium oxidizes, thereby destroying its adhesive properties. (Some integrated circuits utilize aluminum fuses which do not have underlayers—decohesion is a particularly worrisome problem for these circuits.)

Long term reliability issues are particularly worrisome to integrated circuit manufacturing process designers because, of course, these reliability failures do not occur until the already-manufactured devices are in field use. Thus, a manufacturing engineer may be confronted with the unhappy prospect of being forced to modify his production process after hundreds or thousands of integrated circuits have been manufactured because those circuits in field use have exhibited long term reliability problems.

Thus, there exists a need to predict where a metal conductor, such as an aluminum runner will fail after leaving the factory; to predict when the runner might fail; and then, to determine how, if at all, the manufacturing processes might be modified to prevent such a failure in the future.

Those concerned with fabrication of other types of perhaps macroscopic metallized structures are confronted with similar problems.

SUMMARY OF THE INVENTION

These concerns are addressed by the present invention which includes in an illustrative embodiment:

forming a metal runner overlying a substrate;

forming a material layer in contact with at least a portion of the metal runner;

removing the material layer from the metal runner, thereby having bumps upon the metal runner; and measuring the density of the bumps.

In another embodiment, the invention includes:

a method of manufacturing an integrated circuit including forming a dielectric substrate;

forming a metal runner overlying the substrate; the metal runner being manufactured according to a set of process parameters; these process parameters being chosen by method which includes forming a plurality of test samples, each sample having a substrate and a respective overlying runner; each sample being formed according to a respective set of process parameters;

forming a respective material layer in contact with at least a portion of each of the runners;

removing the material layer from the runner, thereby leaving bumps upon the metal runner;

measuring the density and density gradient of the bumps on each runner; and choosing at least one runner whose bump density gradient or bump density meets predetermined criteria; and selecting the chosen runner's respective set of process parameters to manufacture the integrated circuit.

DETAILED DESCRIPTION

Among applicant's discoveries is a method for testing a metallic structure, illustratively a runner, to determine the existence of stress gradients which will contribute to long term reliability problems. Thus, a plurality of test structures may be fabricated, each structure according to a slightly different manufacturing process or recipe. Applicant's method may be applied to each of the plurality of test structures to determine whether any of these structures has abnormally high stress gradients. The test identifies the location of the abnormally high stress gradients. Those structures which do not exhibit high stress gradients are predicted to have greater long term reliability. Thus, the recipes or processes utilized to produce those structures which do not exhibit abnormally high stress gradients may be utilized to produce a large number of similar structures with confidence that long term reliability problems are unlikely. Details of the method are illustratively described in connection with integrated circuit design and processing. However, the method is generally applicable to other larger structures also.

Figure 1:
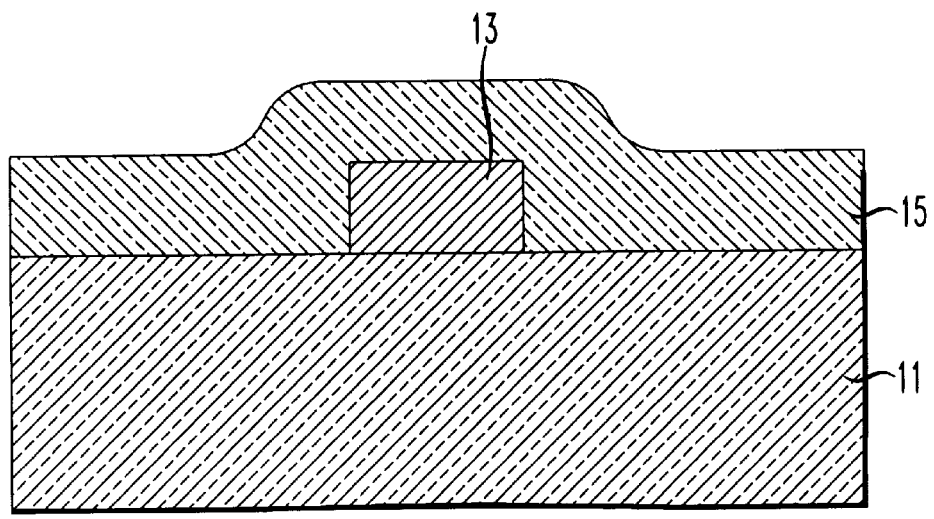
FIG. 1 is a cross sectional view.
Figure 2:
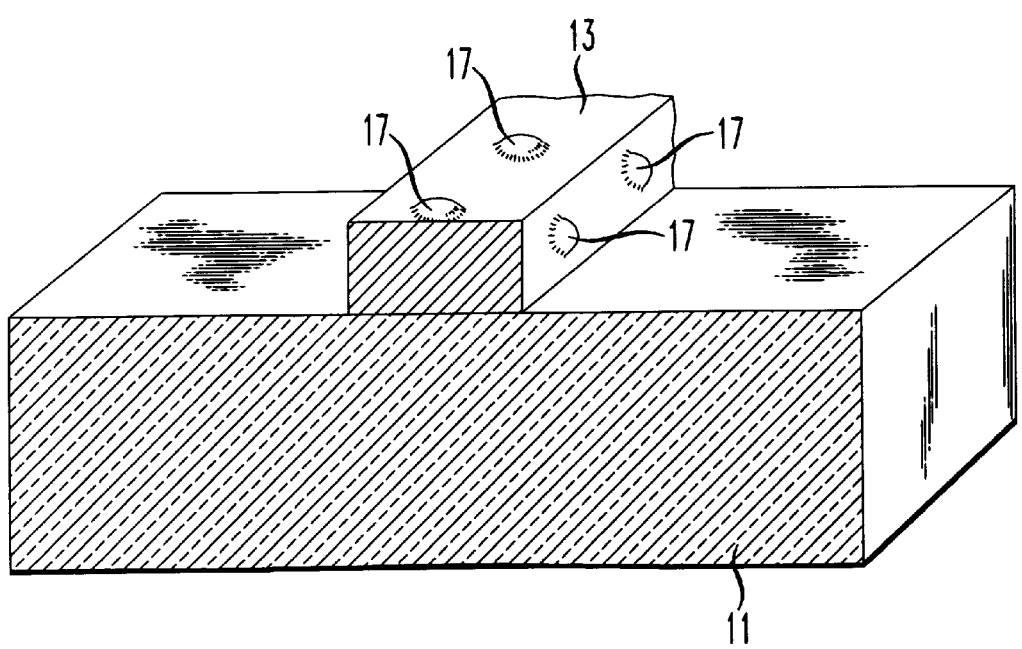
FIG. 2 is partially-cross sectional view of a structure useful in understanding an illustrative embodiment of the present invention.

FIG. 1 represents one of perhaps a plurality of idealized structures. Reference numeral 11 denotes a substrate which may be metal or, more typically, a dielectric, such as a oxide of silicon, either grown or formed from a variety of chemical precursors. Substrate 11 may exhibit topography, although not illustrated in FIG. 1 (i.e. the upper surface of substrate 11 may not be flat). Reference numeral 13 denotes a metal structure. Illustratively, reference numeral 13 may denote a patterned aluminum runner. Overlayers or underlayers, although not shown, may be present. For example, there may exist beneath aluminum runner 13, correspondingly patterned layers of titanium, titanium nitride or both or refractory metal silicide. Similarly, an overlayer of titanium, titanium nitride, or both or refractory metal silicide may be present upon aluminum runner 13. Reference numeral 15 denotes a dielectric, illustratively, a oxide of silicon formed from the decomposition of TEOS or another chemical precursor. Generally speaking the formation of elements 11, 13, and 15 may be accomplished by those of ordinary skill in the art.

Typical integrated circuit manufacturing processes involve a final sintering step. This final sintering step (illustratively performed in a hydrogen atmosphere at temperatures of approximately 400° C. for about an hour) helps to anneal damage to the integrated circuit caused by previous plasma etching processes.

Applicant has found that during the final sintering process that a chemical reaction between metal 13 and silicon dioxide 15 takes place. The reaction creates a compound of aluminum, silicon and oxygen. (The reaction takes place more slowly if sintering is not performed.)

The aluminum-silicon-oxygen compound creates bumps 17 upon the surface of aluminum runner 13 after silicon dioxide layer 15 has been stripped away. (Stripping of silicon dioxide layer 15 may be accomplished by those of skill in the art, illustratively, using a solution of HF.) The bumps are more resistant to etchant attack that the rest of layer 15.

However, it has been found that the distribution of bumps 17 is not uniform along runner 13. The concentration of bumps is greater upon those areas of runner 13 which experience higher compressive stresses; and the concentration of bumps is less in those areas of runner 13 which experience higher tensile stress.

A fluorescent dye, such as cumarin or a dye selected from the family of cyanobiphenyls may be applied to runner 13 to make the bumps more visible.

Applicant's have found, as a general rule of thumb, that when the bump density in a given location is 20% greater or less than the average bump density, that residual stresses are high enough that a long term failure may be predicted at that location.

Essentially, a bump density gradient is a predictor of a stress gradient as an indicator of ultimate long term failure. Consequently, one may fabricate a variety of test structures similar to those of FIG. 1. Each test structure may have runners with associated underlayers and overlayers fabricated according different recipes and, perhaps, upon substrates having topographies of different severity. Each test structure may be characterized by a number of different additional manufacturing or process parameters, such as:

metal deposition temperature, metal thickness, etching recipe (power, gas chemistry) runner geometry (i.e. sidewall slope angle, degree of rounding of upper edges), presence or absence of dopant in underlying substrate dielectric (including dopant concentration if dopant is present), sputter target composition, sinter recipe (time, temperature, atmosphere). (Furthermore, each temperature variable has an associated ramp rate.)

Each test structure may have its bump density (i.e. in bumps/$\mu$m or other units) examined after the associated overlying dielectric is stripped and the bump density is measured. Those test structures which have the most uniform bump density are least likely to fail in the long term. These test structures (or structure) is deemed the most satisfactory for mass production because it is predicted to have the greatest long term reliability. Manufacturing processes for integrated circuits may then be created using similar topographies or manufacturing parameters such as those listed above to the most satisfactory test structure above. A large number of integrated circuits may then be manufactured using the process or recipe which is predicted to have the greatest long term reliability.

The invention concept is not limited to aluminum runners; it is applicable to runners made from other conductors, such as tungsten or copper. Other materials than silicon dioxide 15 may be utilized to form bumps. The method may be applied to runners 13 which are metal mixtures or alloys such as aluminum-silicon, aluminum-copper, or aluminum-silicon-copper.

The invention claimed is:

1. A method comprising:
    forming a metal runner overlying a substrate;
    forming a material layer in contact with at least a portion of said metal runner;
    removing said material layer from said metal runner thereby leaving bumps upon said metal runner;
    measuring the density of said bumps.

2. The method claim 1 in which said metal is predominantly tungsten.

3. The method of claim 1 in which said metal is predominantly aluminum.

4. The method of claim 1 in which said metal is predominantly copper.

5. The method of claim 1 in which said material layer is an oxide of silicon.

6. The method of claim 5 in which said material layer is formed from TEOS.

7. A method of manufacturing an integrated circuit, the method comprising:
    forming a plurality of test samples, each of said test samples having a substrate with at least one metal runner formed thereover and each of said test samples being formed by a respective set of process parameters;
    forming a material layer in contact with at least a portion of each of said at least one metal runners;
    removing said material layer from each of said at least one metal runners thereby leaving bumps on each of said at least one metal runners said bumps having a density and density gradient;
    measuring said density or said density gradient of said bumps on each of said at least one metal runners;
    choosing at least one of said plurality of test samples having said bump density or said bump density gradient which meets a predetermined criteria; and
    selecting said respective process parameters of said chosen at least one of said plurality of test samples to manufacture the integrated circuit.

8. The method of claim 7 in which at least one of said respective process parameters is chosen from the group consisting of:
    metal deposition temperature;
    metal thickness;
    etching recipe;
    runner geometry;
    dopant concentration of dielectric;
    sputter target composition;
    sinter recipe; and
    temperature ramp rate.

* * * * *